(12) United States Patent
Shida (10) Patent No.: US 6,239,670 B1
(45) Date of Patent: May 29, 2001

(54) SHORT-STUB MATCHING CIRCUIT (75) Inventor: Naoki Shida, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/264,566

(22) Filed: Mar. 8, 1999

(30) Foreign Application Priority Data

Mar. 6, 1998 (JP) .................................................. 10-073489

(51) Int. Cl.[7] .................................................. H03H 7/38
(52) U.S. Cl. .......................................... 333/33; 333/22 R
(58) Field of Search .................................. 333/33, 22 R, 333/81 A, 172; 330/292, 302; 257/536; 338/216

(56) References Cited

U.S. PATENT DOCUMENTS 3,354,412 * 11/1967 Steidlitz .............................. 333/22 R
3,634,789 * 1/1972 Stuckert .............................. 333/81 A
3,742,398 * 6/1973 Brown ................................. 333/172
4,310,812 * 1/1982 DeBloois ........................... 333/81 A
4,456,894 * 6/1984 Lapart ................................. 333/22 R
5,406,224 * 4/1995 Mikami et al. .................. 330/302 X

FOREIGN PATENT DOCUMENTS 0 195 649   9/1986   (EP) .
1-233812    9/1989   (JP) .
3-192801    8/1991   (JP) .
4-113701    4/1992   (JP) .
7-44366     5/1995   (JP) .
7-240369    9/1995   (JP) .
7-297655   11/1995   (JP) .
8-250901    9/1996   (JP) .

* cited by examiner

Primary Examiner—Justin P. Bettendorf
Assistant Examiner—Stephen E. Jones
(74) Attorney, Agent, or Firm—Foley & Lardner

(57) ABSTRACT

A short-stub matching circuit connected to a signal transfer line, includes at least one resistor element having a distributed constant effect which is inserted in a transfer path between the signal transfer line and a grounding conductor.

11 Claims, 9 Drawing Sheets

COMPARATIVE EXAMPLE (1)

COMPARATIVE EXAMPLE (1)

SHORT-STUB MATCHING CIRCUIT

BACKGROUND OF THE INVENTION

1. Field of the Invention

The present invention relates to a high-frequency matching circuit, and, more particularly, to a short-stub matching circuit in a monolithic integrated circuit, which is used in the millimeter wave band and microwave band.

2. Description of the Related Art

In designing millimeter wave/microwave amplifiers and making their prototypes, parasitic oscillation generally often worries the designers. This is because a highfrequency transistor to be used as an amplifier element. e.g., a heterojunction FET, has a power gain of greater than 0 dB over a wide frequency range from DC (direct current) to a microwave/millimeter wave band, the circuit meets the oscillation condition in some frequency band.

The stability condition for a transistor is such that with a variable load impedance Z1 connected to the output terminal of the transistor, the absolute value of a reflection coefficient in on the input side is smaller than "1" even when the variable load impedance Z1 lies anywhere within the Smith chart. In other words, no oscillation occurs when the absolute values of the input reflection coefficient in and an output reflection coefficient out are both smaller than "1."

In general, a stability coefficient K, an index, is used to determine whether or not oscillation will occur. Stability can be discriminated by checking if the value of the stability coefficient K is greater than "1." The stability coefficient X is given from the following equation using S parameters of the circuit.

$$K=(1-|S_{11}|^2-|S_{22}|^2+|\Delta|^2)/2 \cdot |S_{12} \cdot S_{21}| \Delta = S_{11} \cdot S_{22} - S_{12} \cdot S_{22} - S_{12} \cdot S_{21}.$$

The condition for absolute stability is K>1 in which case no oscillation occurs with respect to every passive load impedance Z1 unless a feedback circuit Is externally added.

In Japanese Patent Unexamined Publication (Kokai) No. 7-240369, a matching circuit has been disclosed which is designed in consideration of the low-frequency stability in an amplifier circuit. This matching circuit is connected to a radio-frequency (RF) signal transfer line which is connected to the gate electrode of an FET (field effect transistor), and serves as both a bias circuit and a stabilizing circuit.

More specifically, the matching circuit has a λ/4 transfer line connected to the RF signal transfer line, and the λ/4 transfer line is grounded via a first MIM (Metal-Insulator-Metal) capacitor, and is further grounded via a second MIM capacitor and a resistor connected in series, where λ is a wave length. That is, the first MIM capacitor and the second MIM capacitor and the resistor form a parallel circuit.

The capacitance of the first HIM capacitor is set in such a way that the first MIM capacitor becomes nearly short-circuited at the use frequency and becomes nearly an open state at a low frequency outside the use frequency. The capacitance of the second MIM capacitor is set in such a way teat it is greater than the capacitance of the first MIM capacitor and the second MIM capacitor becomes nearly short-circuited at a low frequency outside the use frequency. Therefore, the matching circuit serves as a bias circuit with the λ/4 transfer line grounded via the first MIM capacitor at the use frequency, and serves as a stabilizing circuit for prevention of oscillation, with the λ/4 transfer line grounded via the series-connected second MIM capacitor and resistor at a low frequency outside the use frequency.

In Japanese Patent Unexamined Publication (Kokai) No. 1-233812, another matching circuit has been disclosed which has an oscillation preventing resistor inserted on the opposite side to the short-circuit side of a short-stub for matching. This matching circuit aims at decreasing the number of elements in an oscillation preventing circuit in a monolithic integrated circuit (IC), thereby reducing the chip area. To achieve this purpose, the oscillation preventing resistor is directly formed in the RF signal transfer line.

Figure 14:
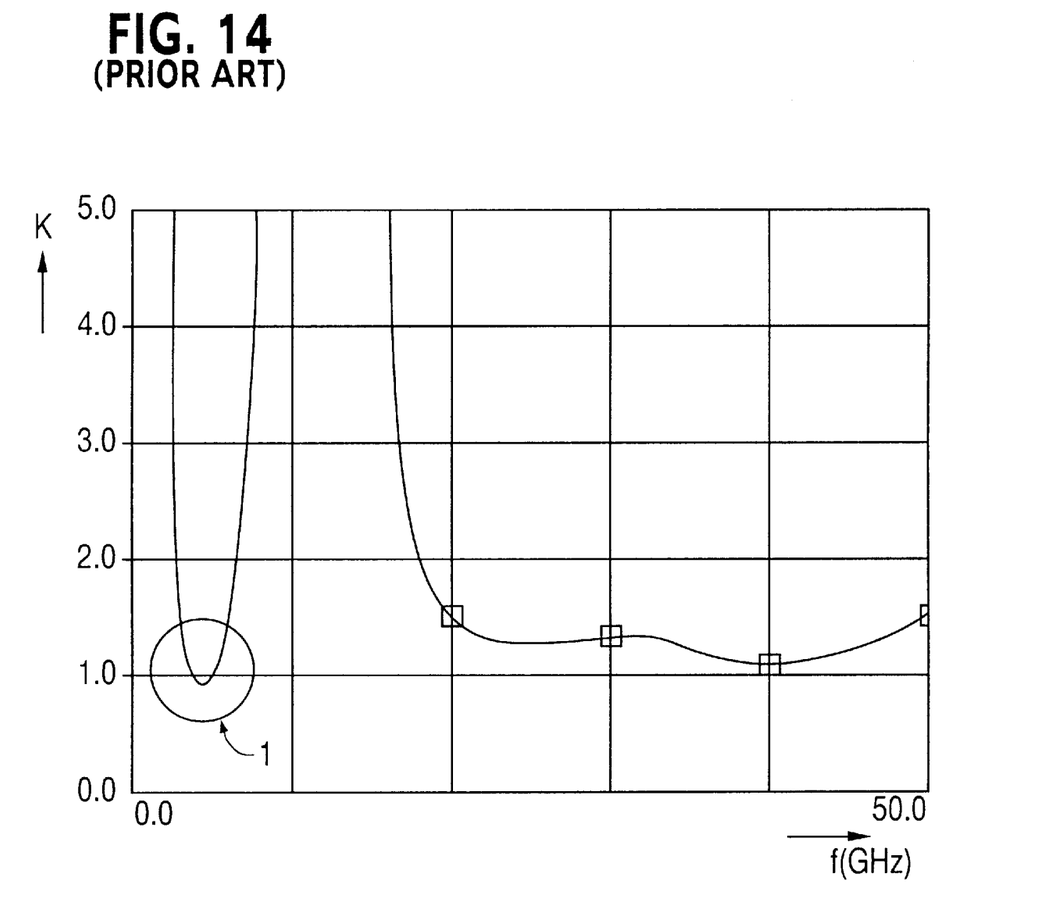
FIG. 14 is a graph showing the stability characteristic of a conventional short-stub matching circuit.

In the matching circuit disclosed in Unexamined Patent Publication (Kokai) No. 7-240369, however, as shown in FIG. 14, there is an area 1 where the stability coefficient K becomes K<1 at a low frequency near 10 GHz. This matching circuit thus does not satisfy the complete stability condition.

Because the matching circuit disclosed in Unexamined Patent Publication (Kokai) No. 1-233812 has the oscillation preventing resistor directly formed as a semiconductor resistor in the RF signal transfer line, the degree of freedom at the time of implementing trimming in the fabrication process of a microwave monolithic IC (MMIC) is significantly limited.

SUMMARY OF THE INVENTION

Accordingly, it is an object of the present invention to provide a stable short-stub matching circuit which causes no parasitic oscillation and has an increased stability coefficient K of 1 or higher.

It is another object of this invention to provide a stable, parasitic-oscillation-free short-stub matching circuit whose fabrication is easily adjustable.

To achieve those objects, a short-stub matching circuit according to this invention includes at least one resistor element having a distributed constant effect that is inserted in a transfer path between said signal transfer line and a grounding conductor. The insertion of the resistor element having a distributed constant effect can permit the value of the stability coefficient K to be easily increased to 1 or more. In addition, as the resistor element having a distributed constant effect can be formed at a later stage of the fabrication process, the degree of freedom at the time of performing trimming becomes greater, thereby ensuring significantly easy adjustment of resistance value of the resistor.

DETAILED DESCRIPTION OF THE PREFERRED EMBODIMENTS

Preferred embodiments of the present invention will now be described with reference to the accompanying drawings.

FIRST EMBODIMENT

The first embodiment has a microstrip line on a GaAs substrate and a resistor having a distributed constant effect, with the center frequency of 40 GHz.

Figure 1:
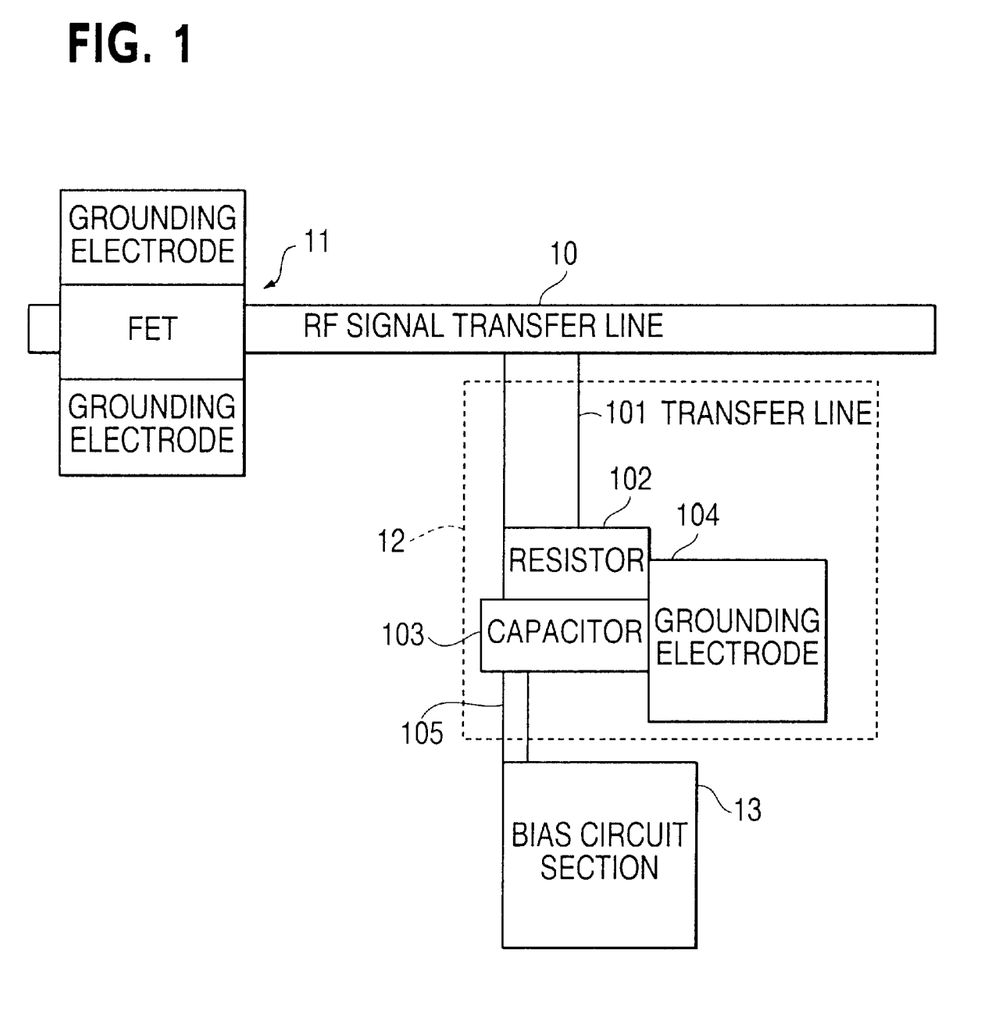
FIG. 1 is a schematic diagram illustrating the planar structure of an MMIC which uses a short-stub matching circuit according to a first embodiment of this invention.

As shown in FIG. 1, an RF signal transfer line 10 is connected to the gate electrode of an FET 11 formed on a GaAs substrate. The FET 11 has an AlGaAs/InGaAs-based heterojunction with a gate length of 0.18 $\mu$m, and a gate width Wg of 200 $\mu$m; the bias conditions are a drain bias Vd=4.0 V and a gate bias Vg=−0.6 V. The FET which is used here as an active element demonstrates such a characteristic that the maximum stable power gain (MSG) and the maximum available power gain (MAG) are switched from one to the other at near 60 GHz and the stability coefficient K at or below 60 GHz becomes equal to or smaller than "1" (unstable).

The RF signal transfer line 10 is connected to a bias circuit section 13 via a short-stub matching circuit 12 according to this embodiment. The short-stub matching circuit 12 Is comprised of a transfer line 101. a resistor 102 having a distributed constant effect, a capacitor 103 and a grounding electrode 104. The transfer line 101 has one end connected to the RF signal transfer line 10 and the other end connected to the resistor 102. The resistor 102 is further connected to the grounding electrode 104 via the capacitor 103, and is connected to the bias circuit section 13 via the capacitor 103 and a bias supply line 10S The transfer line 101, the resistor 102 having a distributed constant effect and the capacitor 103 constitute the short-stub matching circuit with the center frequency of 40 GHz. This short-stub matching circuit serves as a matching circuit in the use frequency band and serves as a stabilizing circuit to prevent parasitic oscillation in a low-frequency band outside the use frequency.

Particularly, the resistor 102 having a distributed constant effect can be formed following a wiring step of forming a circuit pattern for the RF signal transfer line 10, the transfer line 101 and the like. Specifically, after a wiring base film is formed by sputtering, gold wires are formed on the wiring base film and the resistor 102 made of metal resistor material with a distributed constant is further formed on the wiring base film. Because of the metal resistor, a post process like adjustment of the resistance by, for example, trimming becomes considerably easier.

For the resistor 102 to have a distributed constant effect, it is desirable that the resistor 102 should have length equal to or greater than approximately 1/16 of the signal wavelength at the use frequency. In this example, the transfer line 101 has a length of 130 $\mu$m and a width of 20 $\mu$m, the resistor 102 having a distributed constant effect has a length of 50 $\mu$m, a width of 20 $\mu$m and a resistance 50$\Omega$, and the capacitor 103 has a capacitance of 1 pF.

The influence of the matching circuit of this embodiment on the stability of active elements was checked. According to this embodiment, the short-stub matching circuit is comprised of only the transfer line 101, the resistor 102 having a distributed constant effect and the capacitor 103, and serves as a matching circuit at the use frequency and serves as a stabilizing circuit to prevent parasitic oscillation at a frequency outside the use frequency band due to the use of the resistor 10 having the distributed constant effect. This is because the power is attenuated by the resistor 102, so that the reflection coefficient becomes smaller by a given amount regardless of the frequency. As a result, the input/output reflection coefficient on the Smith chart goes inward of the graph, making it difficult for the reflection coefficient to get greater than "1" even if an external impedance is changed. Despite the power attenuation, the gain drop at the use frequency is less than 1 dB. which is practically insignificant.

Figure 2:
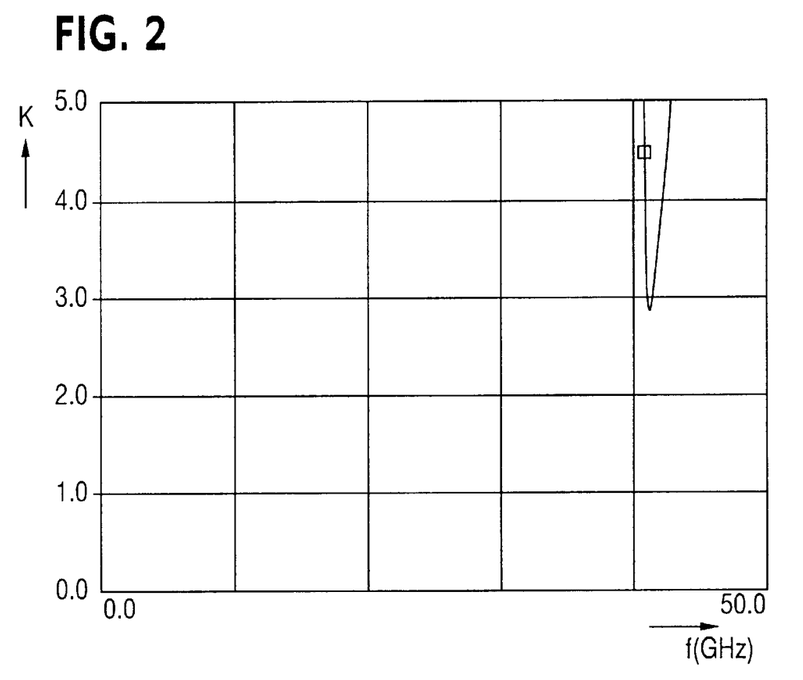
FIG. 2 is a graph showing the stability characteristic of the short-stub matching circuit of the first embodiment.
Figure 3:
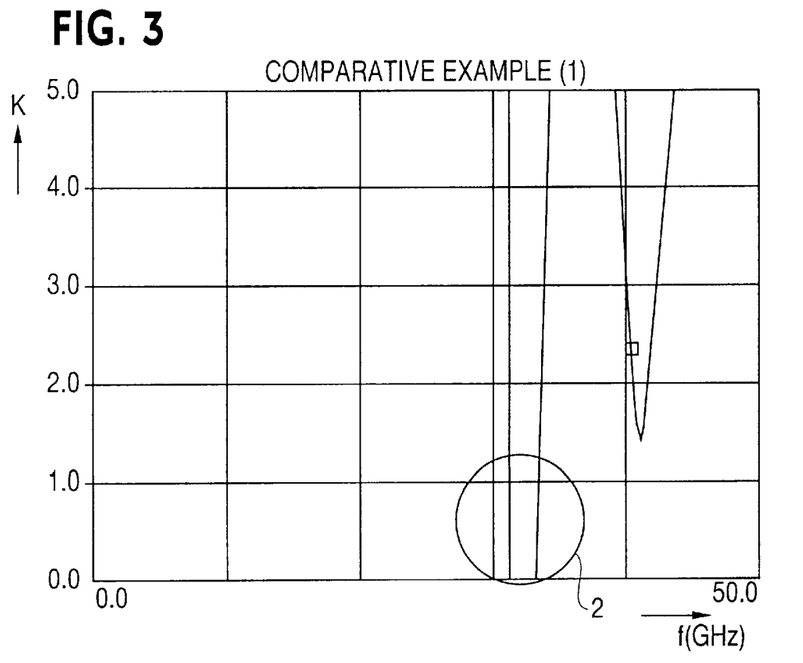
FIG. 3 is a graph showing the stability characteristic of a comparative example (1) which does not have a resistor 102 having a distributed constant effect in the first embodiment.

FIG. 2 shows the stability characteristic of the short-stub matching circuit of the first embodiment, and FIG. 3 shows the stability characteristic of a comparative example (1) which does not have the resistor 102 with a distributed constant effect as used in the first embodiment.

As apparent from FIG. 2, the reduced reflection coefficient causes the stability coefficient K to exceed "1" to in every frequency band in this embodiments, which proves that this invention dramatically improves the circuit stability. In the comparative example (1) shown in FIG. 3, by contrast, the stability coefficient K becomes smaller than "1" in an area as indicated by reference numeral 2 in the vicinity of 30 GHz.

The following will discuss some structures which are fundamentally the same as the structure of the first embodiment but are modified on the arrangement of the resistor. The circuits to be described below can be expected to have the some advantages as those of the first embodiment. Further, it was confirmed that an amplifier circuit with a bias circuit not connected to a short-stub circuit and an amplifier circuit using a short-stub circuit directly grounded via no capacitor had the same advantages as those of the first embodiment.

SECOND EMBODIMENT

The second embodiment, like the first embodiment, has a microstrip line on a GaAs substrate and a resistor having a distributed constant effect, with the center frequency of 76 GHz. To avoid the redundant description, like or same reference numerals are given to those components which are the same as the corresponding components of the first embodiment shown in FIG. 1.

Figure 4:
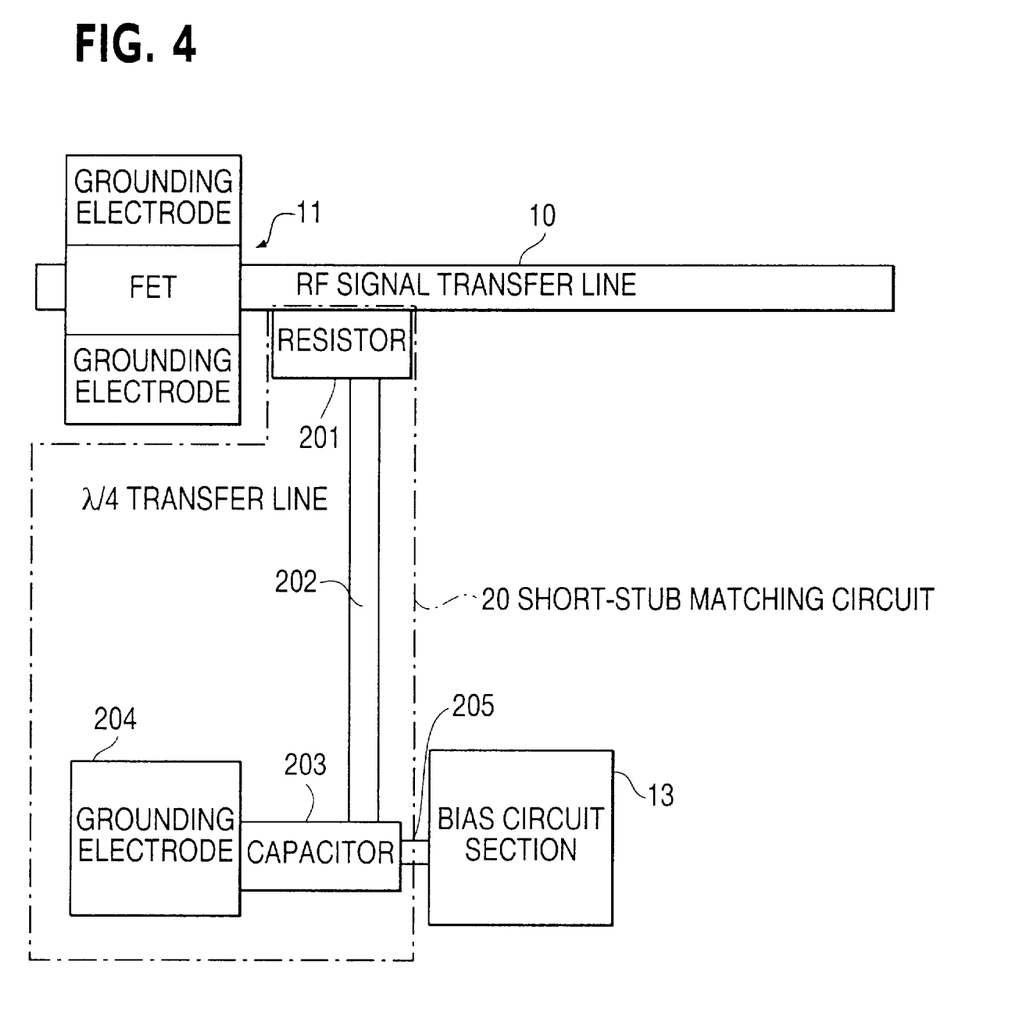
FIG. 4 is a schematic diagram illustrating the planar structure of an MMIC which uses a short-stub matching circuit according to a second embodiment of this invention.

As shown in FIG. 4, the RF signal transfer line 10 is connected to the bias circuit section 13 via a short-stub matching circuit 20 according to the second embodiment. The short-stub matching circuit 20 is comprised of a resistor 201 having a distributed constant effect, a $\lambda/4$ transfer line 202, a capacitor 203 and an grounding electrode 204. The $\lambda/4$ transfer line 202 has one end connected via the resistor 201 to the RF signal transfer line 10 and the other end connected via the capacitor 203 to the grounding electrode 204. The capacitor 203 is further connected to the bias circuit section 13 via a bias supply line 205.

The resistor 201 having the distributed constant effect, the λ/4 transfer line 202, and the capacitor 203 constitute the short-stub matching circuit with the center frequency of 76 GHz. This short-stub matching circuit serves as a matching circuit in the use frequency band and serves as a stabilizing circuit to prevent parasitic oscillation in a low-frequency band outside the use frequency. Particularly, the resistor 201 with the distributed constant effect can be formed in a wiring step similar to the step of forming the RF signal transfer line 10 and the λ/4 transfer line 202, as described in the first embodiment. For the resistor 201 to have a distributed constant effect. it is desirable that the resistor 201 should have a length equal to or greater than approximately 1/16 of the signal wavelength at the use frequency.

Figure 5:
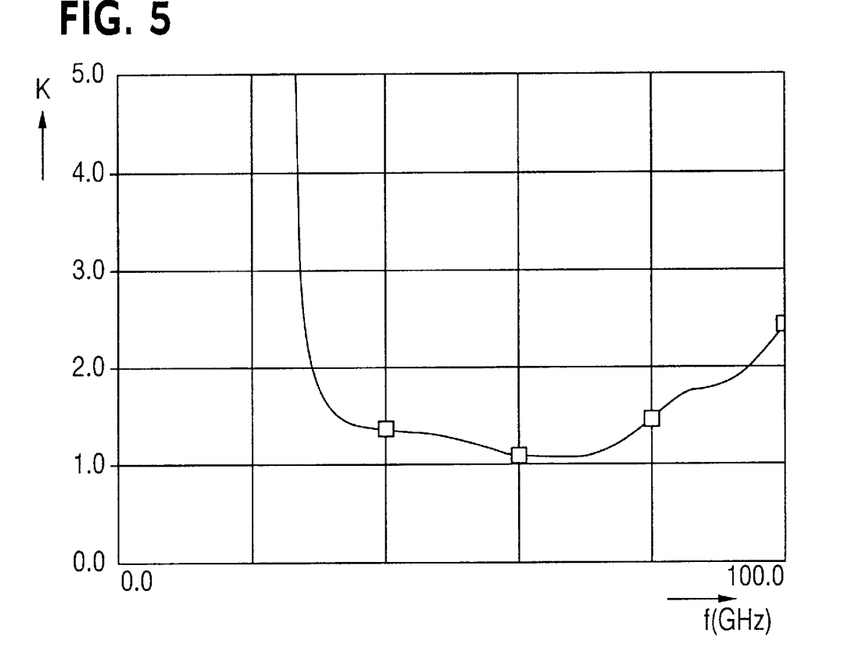
FIG. 5 is a graph showing the stability characteristic of the short-stub matching circuit of the second embodiment.
Figure 6:
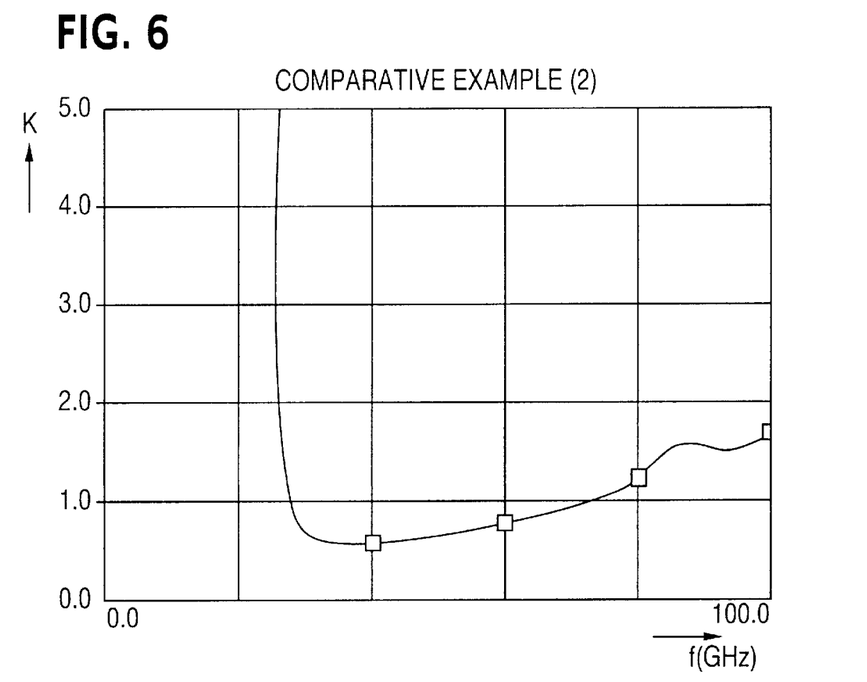
FIG. 6 is a graph showing the stability characteristic of a comparative example (2) which does not have a resistor 201 having a distributed constant effect in the second embodiment.

FIG. 5 shows the stability characteristic of the short-stub matching circuit of the second embodiment, and FIG. 6 shows the stability characteristic of a comparative example (2) which does not have the resistor 201 with a distributed constant effect in the second embodiment.

As shown in FIG. 5, the stability coefficient K exceeds "1" in every band in this embodiments, which proves that this invention significantly improves the circuit stability. In the comparative example (2) shown in FIG. 6, by contrast. the stability coefficient K is smaller than "1" in a wide band of about 30 to 75 GHz.

THIRD EMBODIMENT

The third embodiment. like the first embodiment, has a microstrip line on a GaAs substrate and a resistor having a distributed constant effect, with the center frequency of 76 GHz. To avoid the redundant description, like or same reference numerals are given to those components which are the same as the corresponding components of the first embodiment shown in FIG. 1.

Figure 7:
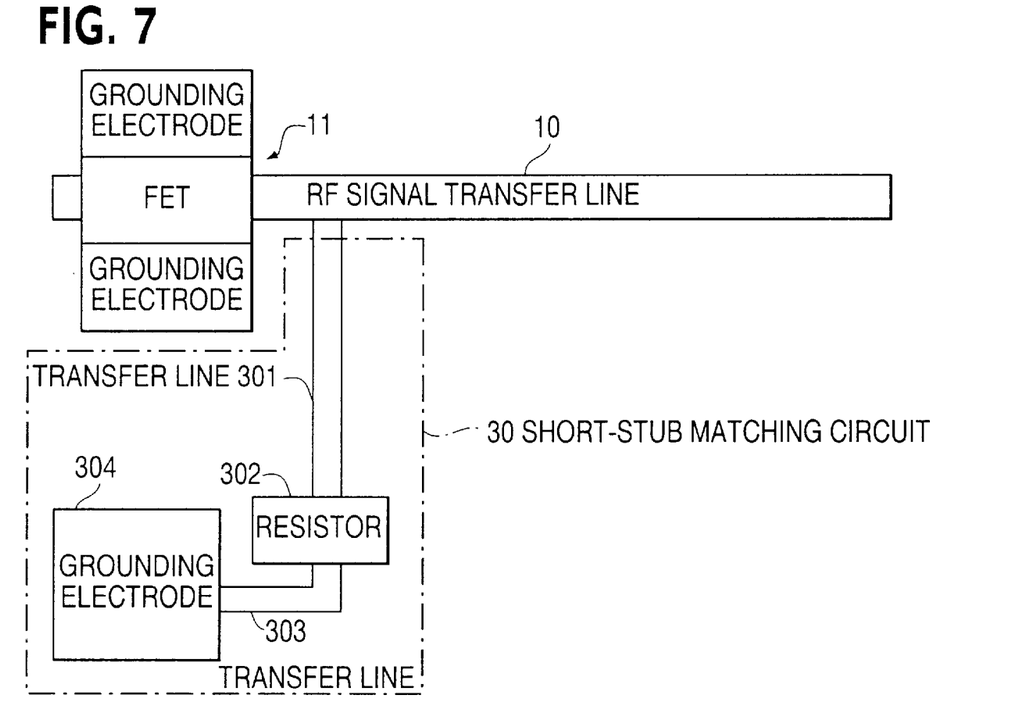
FIG. 7 is a schematic diagram illustrating the planar structure of an MMIC which uses a short-stub matching circuit according to a third embodiment of this invention.

As shown in FIG. 7, the RF signal transfer line 10 is connected to a short-stub matching circuit 30 according to the third embodiment. The short-stub matching circuit 30 is comprised of a transferline 301, a resistor 302 having a distributed constant effect, a transfer line 303 and an grounding electrode 304. The transfer line 301 has one end connected to the RF signal transfer line 10 and the other end connected via the resistor 302 and the transfer line 303 to the grounding electrode 304. In this embodiment, the resistor 302 is grounded without capacitor intervention.

The transfer line 301, the resistor 302 having a distributed constant effect and the transfer line 303 constitute the short-stub matching circuit with the center frequency of 76 GHz. This short-stub matching circuit serves as a matching circuit in the use frequency band and serves as a stabilizing circuit to prevent parasitic oscillation in a low-frequency band outside the use frequency. Particularly, the resistor 302 with a distributed constant effect can be formed in a wiring step similar to the step of forming the RF signal transfer line 10 and the transfer lines 301 and 303, as described in the first embodiment. For the resistor 302 to have a distributed constant effect, it is desirable that the resistor 302 should have a length equal to or greater than approximately 1/16 of the signal wavelength at the use frequency.

Figure 8:
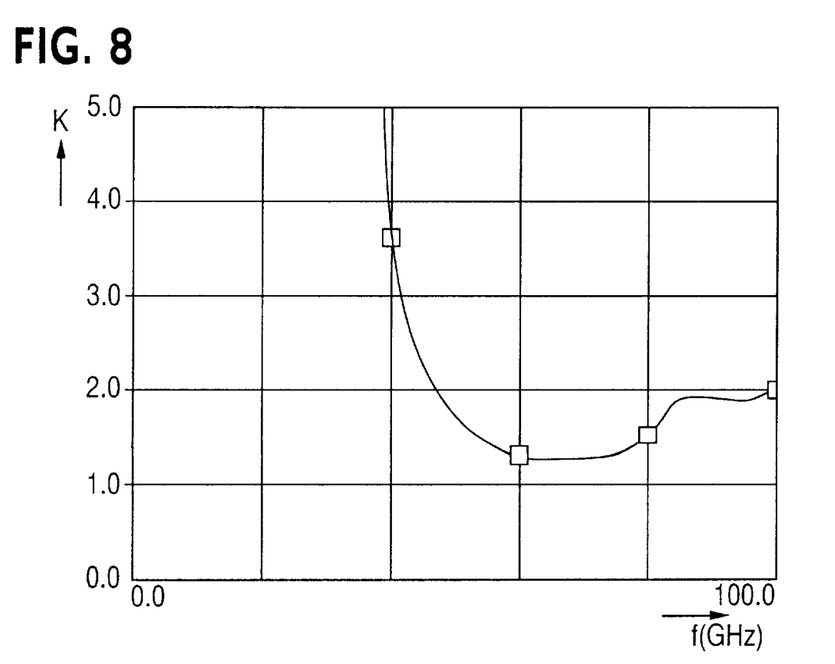
FIG. 8 is a graph showing the stability characteristic of the short-stub matching circuit of the third embodiment.

As shown in FIG. 8, the stability coefficient K exceeds "1" in every band in this embodiments, which proves that this invention significantly improves the circuit stability.

FOURTH EMBODIMENT

The fourth embodiment, like the first embodiment. has a microstrip line on a GaAs substrate and a resistor having a distributed constant effect, with the center frequency of 76 GHz. To avoid the redundant description, like or some reference numerals are given to those components which are the same as the corresponding components of the first embodiment shown in FIG. 1.

Figure 9:
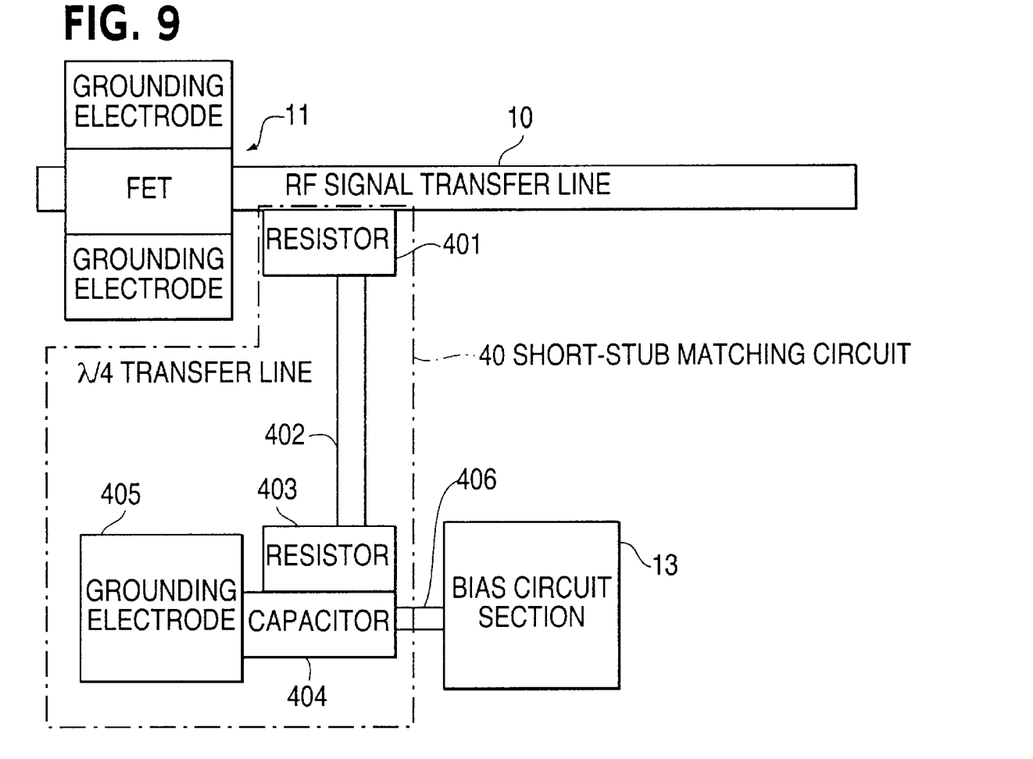
FIG. 9 is a schematic diagram illustrating the planar structure of an MMIC which uses a short-stub matching circuit according to a fourth embodiment of this invention.

As shown in FIG. 9, the RF signal transfer line 10 is connected to the bias circuit section 13 via a short-stub matching circuit 40 according to the fourth embodiment. The short-stub matching circuit 40 is comprised of a resistor 401 having a distributed constant effect, a λ/4 transfer line 402. a resistor 403 having a distributed constant effect, a capacitor 404 and an grounding electrode 405. The λ/4 transfer line 402 has one end connected via the resistor 401 to the RF signal transfer line 10 and the other end connected via the resistor 403 to the capacitor 404. The capacitor 404 is further connected to the grounding electrode 405, and to the bias circuit section 13 via a bias supply line 406.

The resistor 401 having a distributed constant effect, the λ/4 transfer line 402, the resistor 403 having a distributed constant effect, and the capacitor 404 constitute the short-stub matching circuit with the center frequency of 76 GHz. This short-stub matching circuit serves as a matching circuit in the use frequency band and serves as a stabilizing circuit to prevent parasitic oscillation in a low-frequency band outside the use frequency. Particularly, the resistors 401 and 402 both having a distributed constant effect can be formed in a wiring step similar to the step of forming the circuit pattern for the RF signal transfer line 10 and the λ/4 transfer line 402, as described in the first embodiment. For the resistors 401 and 403 to have a distributed constant effect, it is desirable that the resistors 401 and 403 should have lengths equal to or greater than approximately 1/16 of the signal wavelength at the use frequency.

Figure 10:
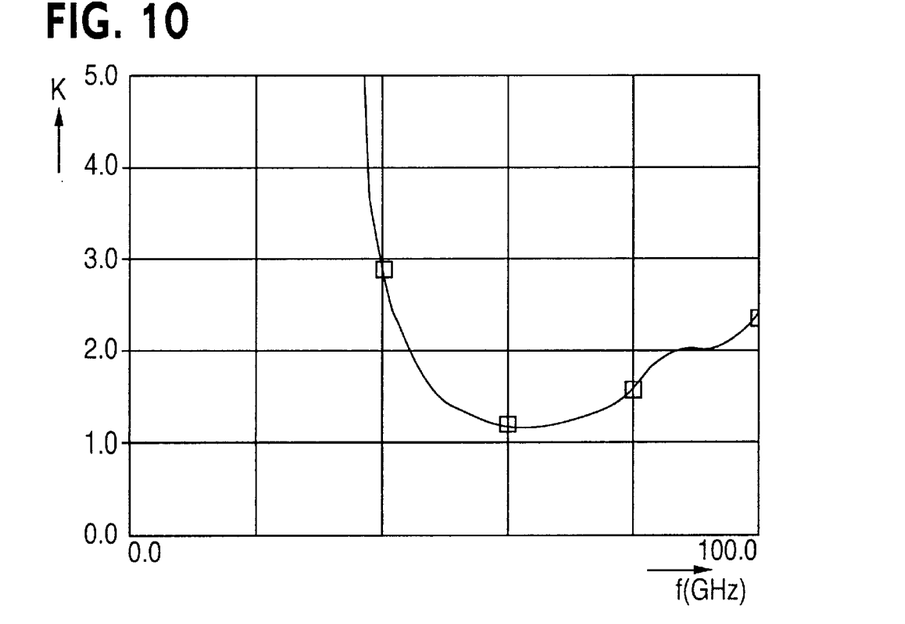
FIG. 10 is a graph showing the stability characteristic of the short-stub matching circuit of the fourth embodiment.

As shown in FIG. 10. the stability coefficient K exceeds "1" in every band in this embodiments, which proves that this invention dramatically improves the circuit stability.

FIFTH EMBODIMENT

The fifth embodiment, as described in the first embodiment, has a microstrip line on a GaAs substrate and a resistor having a distributed constant effect, with the center frequency of 76 GHz. To avoid the redundant description, like or same reference numerals are given to those components which are the same as the corresponding components of the first embodiment shown in FIG. 1.

Figure 11:
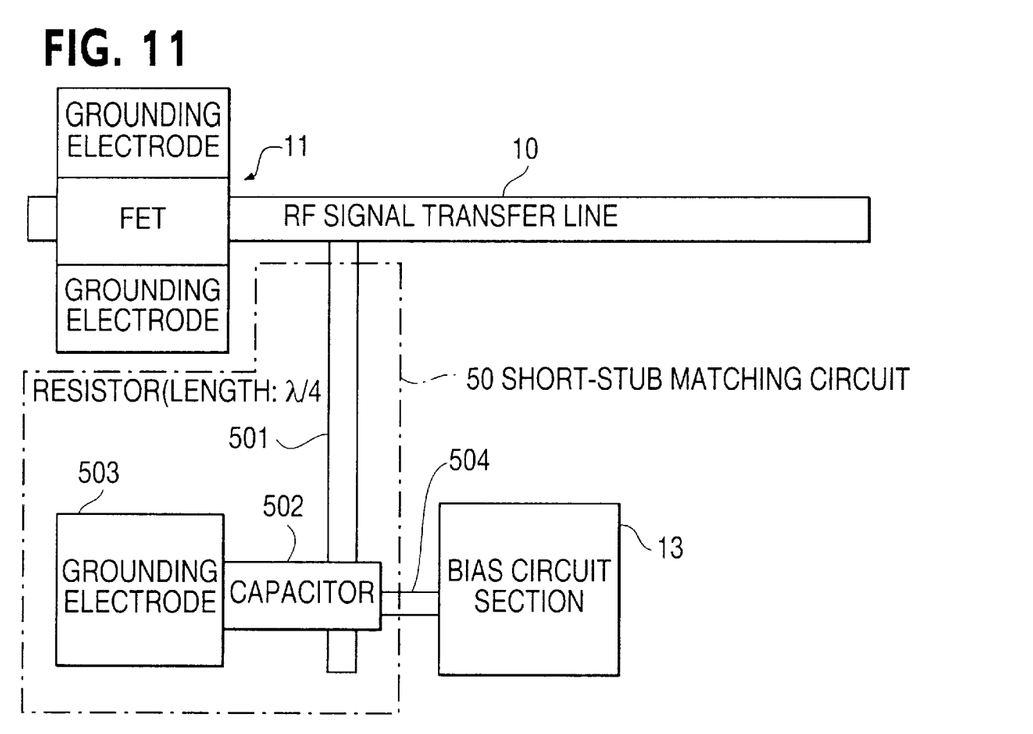
FIG. 11 is a schematic diagram illustrating the planar structure of an MMIC which uses a short-stub matching circuit according to a fifth embodiment of this invention.

As shown in FIG. 11, the RF signal transfer line 10 is connected to the bias circuit section 13 via a short-stub matching circuit 50 according to the fifth embodiment. The short-stub matching circuit 50 is comprised of a resistor 501 having a length of λ/4 and a distributed constant effect. a capacitor 502 and an grounding electrode 503. The λ/4 resistor 501 has one end connected to the RF signal transfer line 10 and the other end connected via the capacitor 502 to the grounding electrode 503. The capacitor 502 is also connected to the bias circuit section 13 via a bias supply line 504.

The λ/4 resistor 501 having a distributed constant effect and the capacitor 502 constitute the short-stub matching circuit with the center frequency of 76 GHz. This short-stub matching circuit serves as a matching circuit in the use frequency band and serves as a stabilizing circuit to prevent parasitic oscillation in a low-frequency band outside the use frequency. Particularly, the λ/4 resistor 501 with a distributed constant effect can be formed in a wiring step similar to the step of forming the circuit pattern for the RF signal transfer line 10, as per the first embodiment. This increases the degree of freedom at the time of trimming.

Figure 12:
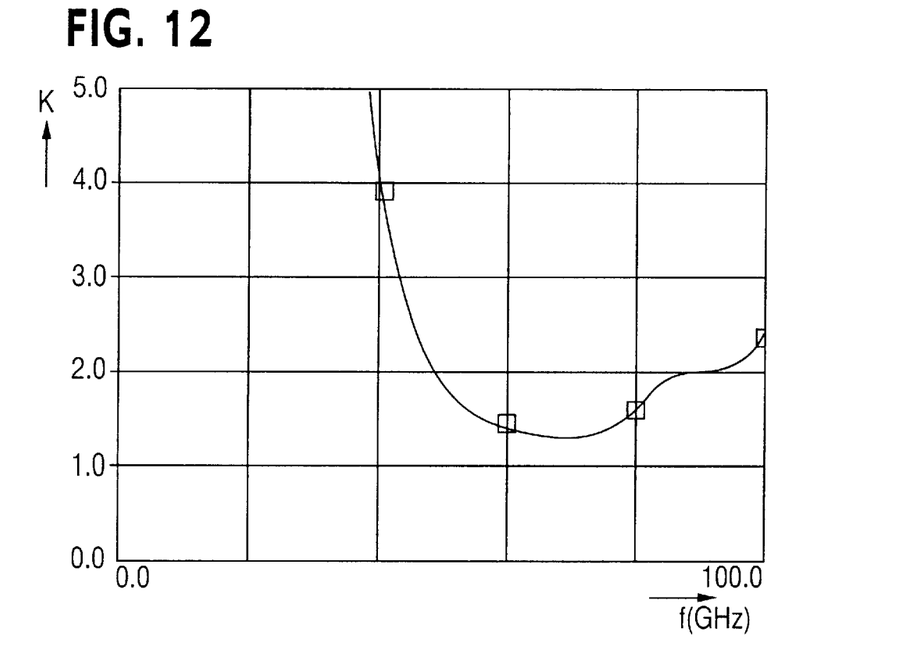
FIG. 12 is a graph showing the stability characteristic of the short-stub matching circuit of the fifth embodiment.

As shown in FIG. 12, the stability coefficient K exceeds "1" in every band in this embodiments, which proves that this invention significantly improves the circuit stability.

Although not illustrated, it was confirmed that a matching circuit with the capacitor 502 of FIG. 11 removed and having the $\lambda/4$ resistor 501 connected directly to the grounding electrode 503 also met the condition K>1 in every band.

Figure 13A:
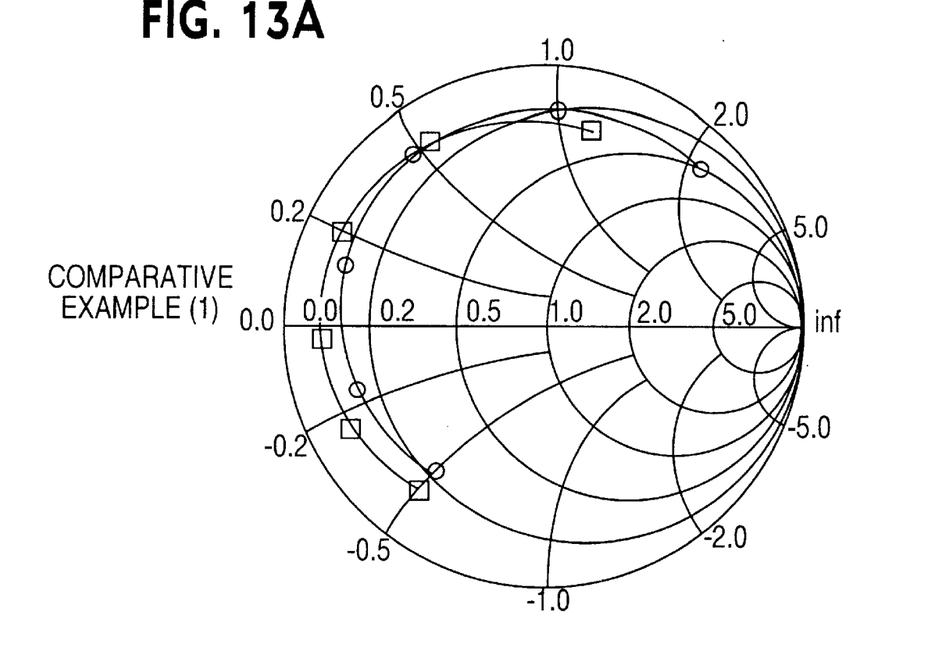
FIG. 13A is a Smith chart showing reflection coefficients at a low-frequency area of the comparative example (1)
Figure 13B:
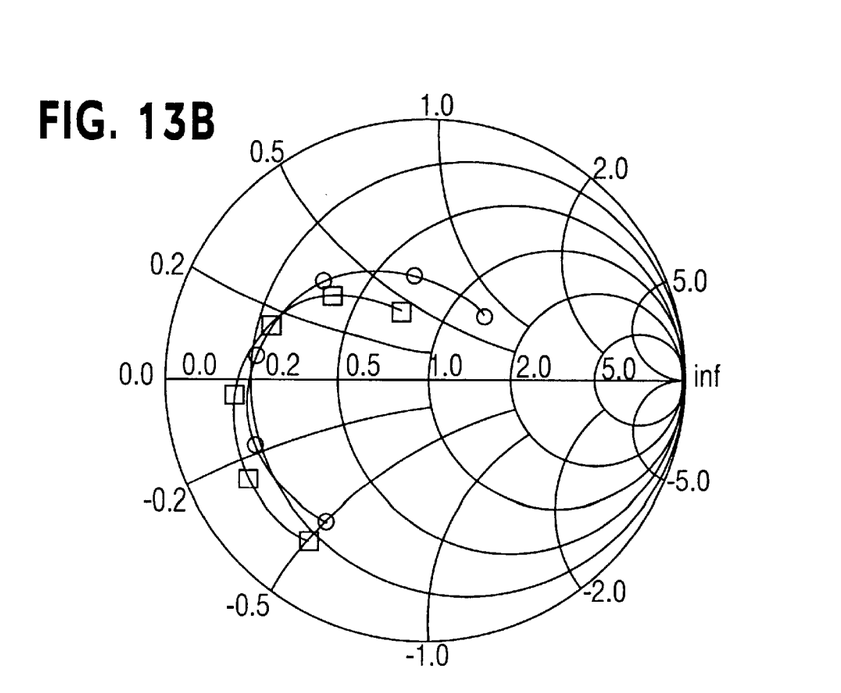
FIG. 13B is a Smith chart showing reflection coefficients at a low-frequency area of the first embodiment.

In FIGS. 13A and 13B, each curve indicated by box-like dot shows the reflection coefficients ($S_{11}$) as viewed from the input side, and each curve indicated by circle-like dot shows the reflection coefficients ($S_{22}$) as viewed from the output side.

The reflection coefficients in the first embodiment shown in FIG. 13B lie more inward of the Smith chart than those of the comparative example (1) depicted in FIG. 13A, and are thus smaller than the latter ones. This indicates a difficulty of the reflection coefficients to become greater than "1" even when the external impedance changes.

According to this invention, as described above, a stability coefficient K>1 inside and outside the use frequency can be achieved and a stable MMIC can easily be realized by inserting a resistor having a distributed constant effect in a path through which the RF signal transfer line is grounded. Further, as a resistor having a distributed constant effect is used, this resistor can be formed at a later stage of the fabrication process, so that the degree of freedom at the time of executing trimming becomes greater, thereby ensuring considerably easy adjustment of resistance of the resistor.

Although five embodiments of the present invention have been described herein, it should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein. but may be modified within the scope of the appended claims.

What is claimed is:

1. A short-stub matching circuit connected to a signal transfer line, comprising:

at least one resistor element having a distributed constant effect, inserted in a transfer path between said signal transfer line and a grounding conductor, wherein said transfer path comprises:
a first resistor element connected to said signal transfer line and having a distributed constant effect;
a transfer line connected to said signal transfer line via said first resistor element, the transfer line having a length equivalent to ¼ of a wavelength of a signal to be transferred through said signal transfer line;
a second resistor element connected to said transfer line and having a distributed constant effect; and
a capacitor element via which said second resistor element is connected to said grounding conductor.

2. The short-stub matching circuit according to claim 1, wherein said signal transfer line is connected to a control electrode of an amplifier, and a bias supply line for supplying a bias voltage to the amplifier is connected via said capacitor element to said signal transfer line.

3. A short-stub matching circuit connected to a signal transfer line, comprising:

at least one resistor element having a distributed constant effect, inserted in a transfer path between said signal transfer line and a grounding conductor, wherein said transfer path comprises:
said resistor element connected to said signal transfer line;
a transfer line connected to said signal transfer line via said resistor element, the transfer line having a length equivalent to ¼ of a wavelength of a signal to be transferred through said signal transfer line; and
a capacitor element via which said transfer line is connected to said grounding conductor.

4. The short-stub matching circuit according to claim 3, wherein said signal transfer line is connected to a control electrode of an amplifier, and a bias supply line for supplying a bias voltage to the amplifier connected via said capacitor element to said signal transfer line.

5. The short-stub matching circuit according to claim 3, wherein said resistor element has a length equal to or greater than ¹⁄₁₆ of a wavelength of a signal to be transferred through said signal transfer line.

6. A short-stub matching circuit connected to a signal transfer line, comprising:

at least one resistor element having a distributed constant effect, inserted in a transfer path between said signal transfer line and a grounding conductor, wherein said transfer path comprises:
a line-shaped resistor element connected to said signal transfer line, having a length equivalent to ¼ of a wavelength of a signal to be transferred through said signal transfer line, and having a distributed constant effect; and
a capacitor element via which said line-shaped resistor element is connected to said grounding conductor.

7. The short-stub matching circuit according to claim 6, wherein said signal transfer line is connected to a control electrode of an amplifier, and a bias supply line for supplying a bias voltage to the amplifier is connected via said capacitor element to said signal transfer line.

8. The short-stub matching circuit according to claim 6, wherein said resistor element has a length equal to or greater than ¹⁄₁₆ of a wavelength of a signal to be transferred through said signal transfer line.

9. A short-stub matching circuit connected to a signal transfer line, comprising:

at least one resistor element having a distributed constant effect, inserted in a transfer path between said signal transfer line and a grounding conductor, wherein said transfer path comprises:
a first transfer line connected to said signal transfer line at a first end of said first transfer line;
said resistor element having a first end connected to a second end of the first transfer line;
a second transfer line having a first end connected to a second end of the resistor element; and
a capacitor element via which a second end of the second transfer line is connected to said grounding conductor.

10. The short-stub matching circuit according to claim 9, wherein said resistor element has a length equal to or greater than ¹⁄₁₆ of a wavelength of a signal to be transferred through said signal transfer line.

11. The short-stub matching circuit according to claim 9, wherein said second signal transfer line is connected to a control electrode of an amplifier, and a bias supply line for supplying a bias voltage to the amplifier is connected via said capacitor element to said signal transfer line.

* * * * *